(12) United States Patent
Kwak

(10) Patent No.: US 7,893,613 B2
(45) Date of Patent: Feb. 22, 2011

(54) ORGANIC LIGHT-EMITTING DISPLAY DEVICE HAVING A FRIT SEAL AND METHOD FOR FABRICATING THE SAME

(75) Inventor: Won Kyu Kwak, Seongnam-si (KR)

(73) Assignee: Samsung Mobile Display Co., Ltd. (KR)

( * ) Notice: Subject to any disclaimer, the term of this patent is extended or adjusted under 35 U.S.C. 154(b) by 493 days.

(21) Appl. No.: 11/641,359

(22) Filed: Dec. 19, 2006

(65) Prior Publication Data

US 2007/0176553 A1    Aug. 2, 2007

(30) Foreign Application Priority Data

Jan. 27, 2006   (KR) ...................... 10-2006-0008763

(51) Int. Cl.
*H01J 1/62* (2006.01)
(52) U.S. Cl. ...................... 313/512; 313/506
(58) Field of Classification Search .......... 313/498–512
See application file for complete search history.

(56) References Cited

U.S. PATENT DOCUMENTS

| | | | |
|---|---|---|---|
| 2003/0173897 A1* | 9/2003 | Iwase et al. | 313/512 |
| 2004/0207314 A1 | 10/2004 | Aitken et al. | |
| 2005/0029513 A1 | 2/2005 | Kawashima et al. | |
| 2005/0238803 A1* | 10/2005 | Tremel et al. | 427/180 |
| 2005/0238908 A1* | 10/2005 | Hikmet et al. | 428/690 |
| 2005/0248270 A1* | 11/2005 | Ghosh et al. | 313/512 |
| 2006/0082298 A1 | 4/2006 | Becken et al. | |

FOREIGN PATENT DOCUMENTS

| | | |
|---|---|---|
| JP | 56-26395 | 3/1981 |
| JP | 1999-23121 | 8/1999 |
| JP | 2001-174620 | 6/2001 |

(Continued)

OTHER PUBLICATIONS

Search report for European Application No. 07101067.2 dated Jun. 19, 2007, 5 pages.

(Continued)

*Primary Examiner*—Bumsuk Won
(74) *Attorney, Agent, or Firm*—Knobbe Martens Olson & Bear LLP

(57) ABSTRACT

Disclosed is an organic light-emitting display device capable of blocking the infiltration of oxygen and moisture, etc. by encapsulating a first and a second substrate with a frit, simplifying the process and effectively preventing light leakage. In one embodiment, the organic light-emitting display device is a bottom emission type organic light-emitting display device including a first substrate with a pixel region including a plurality of organic light-emitting diodes and a non-pixel region around the pixel-region, a second substrate disposed on the upper part of the first substrate to be overlapped with the pixel region and at least part of the non-pixel region, and a frit formed in the entire inner side of the second substrate, wherein the frit corresponding to at least the non-pixel region is formed to be thicker than the frit overlapped with the pixel region, and the first and the second substrates are bonded to each other by the frit in the non-pixel region.

16 Claims, 6 Drawing Sheets

FOREIGN PATENT DOCUMENTS

| | | |
|---|---|---|
| JP | 2005-527076 | 9/2005 |
| JP | 2006-012742 | 1/2006 |
| JP | 2006-524419 | 10/2006 |
| WO | WO 03/005774 | 1/2003 |
| WO | WO 2004-095597 A2 | 11/2004 |

OTHER PUBLICATIONS

Office Action dated May 26, 2009 of the Japanese Patent Application No. 2006-199920.

Japanese Office Action issued Jun. 22, 2010 in Corresponding Japan Application No. 2006-199920.

* cited by examiner

ORGANIC LIGHT-EMITTING DISPLAY DEVICE HAVING A FRIT SEAL AND METHOD FOR FABRICATING THE SAME

CROSS-REFERENCE TO RELATED APPLICATIONS

This application claims the benefit of Korean Patent Application No. 2006-0008763, filed on Jan. 27, 2006, in the Korean Intellectual Property Office, the disclosure of which is incorporated herein by reference.

BACKGROUND OF THE INVENTION

1. Field of the Invention

The present invention relates to an organic light-emitting display device and method for fabricating the same. More particularly, the invention relates to an organic light-emitting display device and method for fabricating the same, capable of blocking the infiltration of oxygen and moisture, etc. by encapsulating a first and a second substrate with a frit, simplifying the process and effectively preventing light leakage.

2. Description of the Related Art

An organic light-emitting display device is one sort of a flat display device wherein an organic light-emitting layer is positioned between electrodes opposed to each other and a voltage is then applied between the electrodes so that holes and electrons injected from the respective electrodes to the organic light-emitting layer are coupled, and the exciting molecules thus generated are returned to a base state, thereby, emitting energy as light.

The organic light-emitting display device is excellent in terms of light-emitting efficiency, brightness, viewing angle and a response speed and can be fabricated to be light weight and thin and therefore, has been spotlighted as a next generation display.

The organic light-emitting display device can include a pair of substrates joined together by a material, e.g., a glass frit that seals the substrates together to protect the materials from exposure to moisture and/or other contaminants. One of the substrates may be a transparent substrate through which the organic light-emitting display device can be viewed while the other may be non-transparent, preferably comprising a black matrix to prevent light leakage from interfering with the light emitted by the pixels.

The frit as above can comprise a black absorbing tint in order to block light and function as a black matrix, BM, thereby preventing light leakage. Light leakage is a phenomenon due to the reflection of light external to the back substrate, causing a problem that the image quality is deteriorated when the light leakage is generated. However, the frit is typically applied to only the outer edge of the display region to be encapsulated, that is, the part on which an organic light-emitting pixel element is not formed. Thus the frit is ineffective in functioning as a black matrix. In order to complement this, in the prior art a light shielding film is additionally formed on the back substrate causing the back substrate to be opaque. However, this added step complicates the fabrication process and the process time is extended.

Therefore, a method of blocking an infiltration of oxygen and moisture into the space between the two substrates by encapsulating the two substrates with the frit, while simplifying the process and effectively preventing light leakage is needed.

SUMMARY OF THE INVENTION

One aspect of the invention provides an organic light-emitting device. This device includes a first substrate, a second substrate, an array of light-emitting pixels interposed between the first and the second substrate, a frit layer formed between the second substrate and the array, and a frit seal interconnecting the first substrate and the frit layer while surrounding the array such that the frit layer, the frit seal and the first substrate form an enclosed space where the array is located.

In the above described device, the frit layer may be substantially non-transparent to visible light. The frit layer may be formed on the second substrate where the second substrate is formed in a single layer or multiple layers. The frit layer may not be adhered to the array of light emitting pixels. At least one of the frit layer and the frit seal may comprise a glass material, and at least one of a filler material to adjust absorption characteristics, and a filler material to adjust thermal expansion characteristics. The first substrate and the second substrate may be transparent.

Another aspect of the invention provides an organic light-emitting device. This device includes a first substrate, a second substrate, an array of light-emitting pixels interposed between the first and the second substrates, where the second substrate is thinner in an inner portion opposite the array than in an outer portion surrounding the inner portion, and a frit layer formed over the inner and the outer portions of the second substrate facing the first substrate such that the frit layer over the inner and outer portions in combination with the first substrate form an enclosed space where the array is located, where the first substrate and the second substrate are adhered to each other by the frit layer in the outer portion.

In the above described device, the frit layer may be formed over the inner and outer portions of the second substrate in substantially the same thickness. The frit layer May be substantially non-transparent to visible light.

Another aspect of the invention provides a method of making an organic light-emitting device. This method includes providing an unfinished device comprising a first substrate and an array of organic light emitting pixels, providing a second substrate, a frit layer and a peripheral frit, wherein the frit layer is formed over a surface of the second substrate, wherein the peripheral frit surrounds the frit layer and is connected to the frit layer, placing the second substrate over the unfinished device such that the array is interposed between the first substrate and the frit layer, wherein after placing the peripheral frit surrounds the array, and melting and resolidifying at least part of the peripheral frit so as to interconnect the unfinished device and the second substrate via the peripheral frit.

In the above described method, the frit layer may be substantially non-transparent to visible light. The peripheral frit may be thicker than the frit layer, wherein the thickness is measured perpendicular to the surface of the second substrate. Melting the peripheral frit may include irradiating the peripheral frit with laser or infrared rays. A wavelength of the laser or infrared rays may be set to be from about 800 nm to about 1200 nm. The method may further include masking at least a portion of the frit layer while irradiating the peripheral frit. The peripheral frit may be applied to at least one of the first substrate and the second substrate in a form of a paste comprising a glass material and a filler material to adjust absorption characteristics, while the method may further include heating the peripheral frit to a temperature sufficient to cure the frit paste. Heating the frit paste may include irradiating the frit paste with laser or infrared rays. The frit paste may be heated to a temperature in a range from about 300° C. to about 500° C.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF PREFERRED EMBODIMENTS

Hereinafter, preferred embodiments of the present invention, proposed so that a person having ordinary skill in the art can easily carry out the present invention, will be described in a more detailed manner with reference to the accompanying figures.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
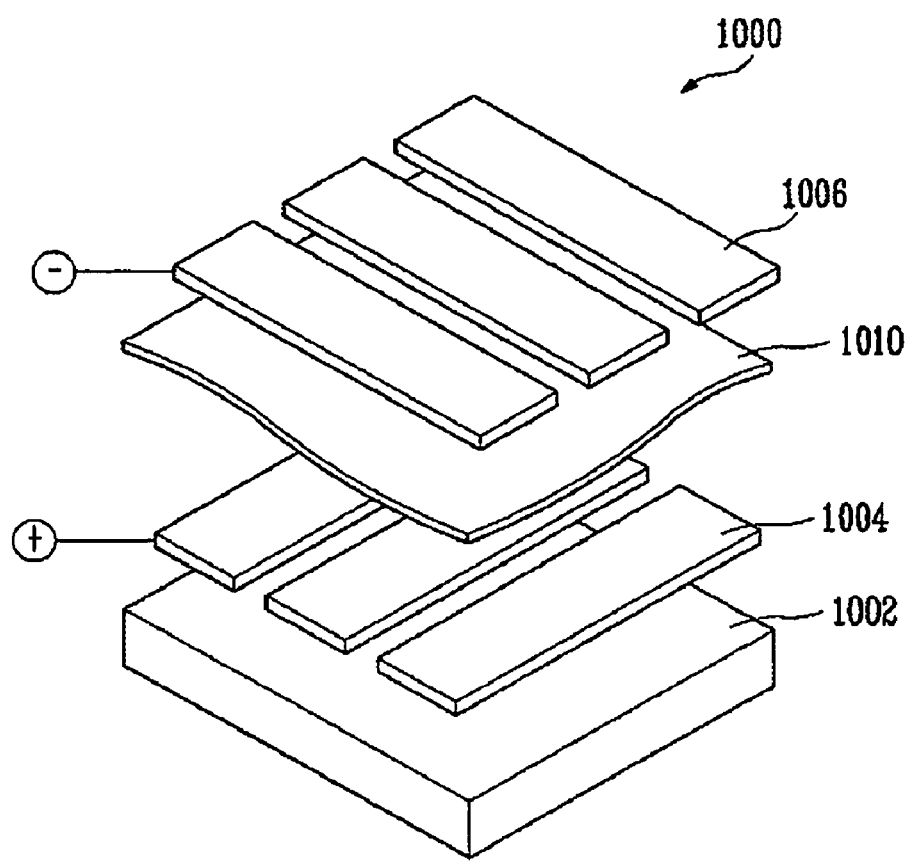
FIG. 7A is a schematic exploded view of a passive matrix type organic light emitting display device in accordance with one embodiment.
Figure 7B:
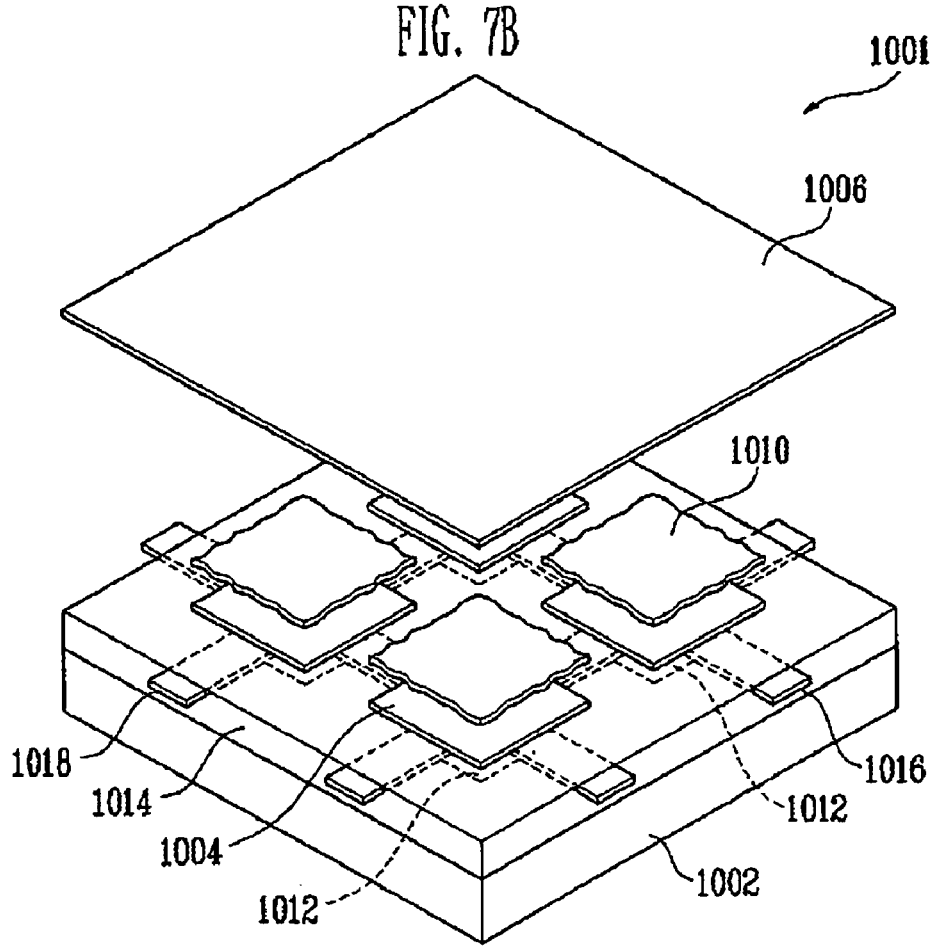
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
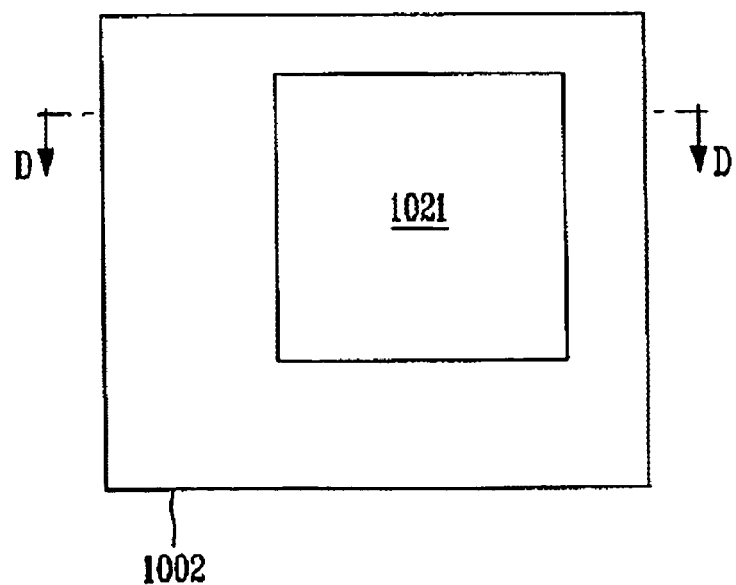
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
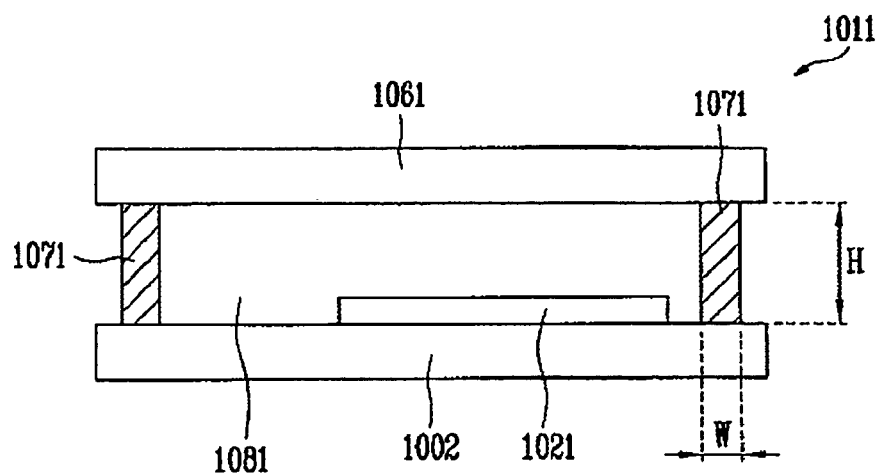
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or "glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
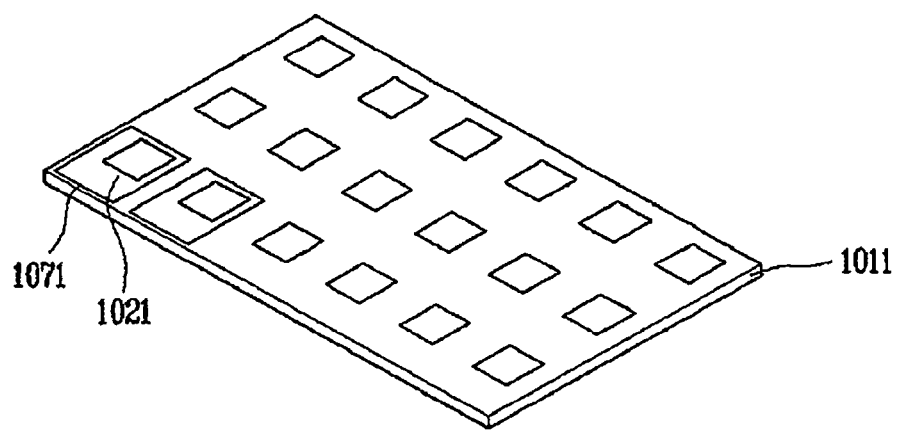
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
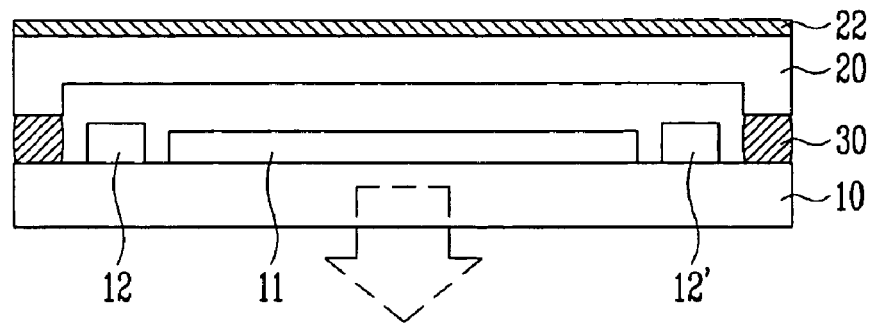
FIG. 1 is a cross-sectional view of a general organic light-emitting display device.

FIG. 1 is a cross-sectional view of an organic light-emitting display device. The display device shown in FIG. 1 is a bottom emission embodiment.

Referring to FIG. 1, an organic light-emitting display device is configured including a first substrate 10 and a second substrate 20 positioned to be opposed to each other, where the first and the second substrates 10 and 20 are adhered to each other with encapsulating material 30 and the inner side thereof is thus encapsulated.

The first substrate 10 is a substrate comprising a pixel region 11 and a driving circuit such as scan drivers 12 and 12' formed thereon, wherein the pixel region 11 is provided with a plurality of pixels having at least one organic light-emitting diode (not shown), and the driving circuit is provided in a non-pixel region which is the region other than the pixel region 11.

The second substrate 20 is adhered to be opposed to the side of the first substrate 10 on which the pixel region 11 and the scan driver 12 and 12' are formed. The second substrate 20 in the embodiment shown is adhered to the first substrate 10 so that at least one region of the first substrate 10, in particular the pixel region 11, is encapsulated. In the front of the second substrate 20 of this embodiment a light shielding film 22, for preventing a transmission of external light or light leakage is provided. A black tape, for example, can be used as the light shielding film 22. In other embodiments, when the light shielding film 22 is not provided, the second substrate 20 can be made to be opaque.

The encapsulating material 30, comprising epoxy resin, is applied along the edge of the first substrate 10 and the second substrate 20, is melted by irradiation of ultraviolet rays, etc. and is thus cured, adhering the first substrate 10 to the second substrate 20. The encapsulating material 30 of this embodiment is used to prevent the infiltration of oxygen and moisture, etc. into the pixel region 11 located in the encapsulated space between the first substrate 10 and the second substrate 20.

However, even though the encapsulating material 30 is applied, the infiltration of oxygen and moisture, etc. through fine cracks cannot be completely blocked. In order to prevent this infiltration, a moisture absorbent material (not shown), etc., is coated on the sealing substrate 20, and is then burned. However, the adhesion between the encapsulating material 30 and the substrates 10 and 20 is deteriorated due to outgassing generated when the moisture absorbent material is burned, causing a problem that the pixel region 11 can be exposed to oxygen and moisture.

U.S. Patent Laid-Open Publication No. 2004-0207314 discloses a structure to encapsulate at least one region including the pixel region 11 of the first substrate 10 by applying a frit to a glass substrate without having moisture absorbent material therein. According to this published patent, since the space between the two substrates is completely encapsulated by curing the melted frit, the moisture absorbent material is not needed and thus the pixel region 11 can be more effectively protected.

Figure 2:
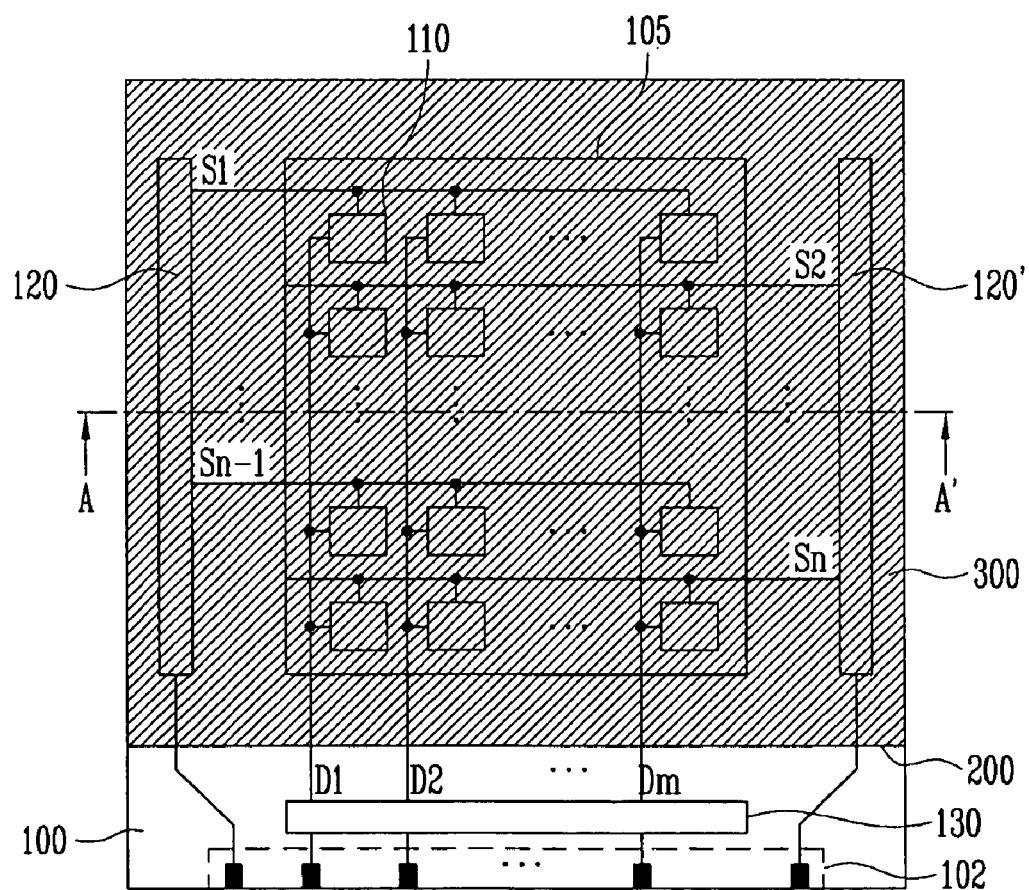
FIG. 2 is a plan view of an organic light-emitting display device according to the embodiment of the present invention.
Figure 3:
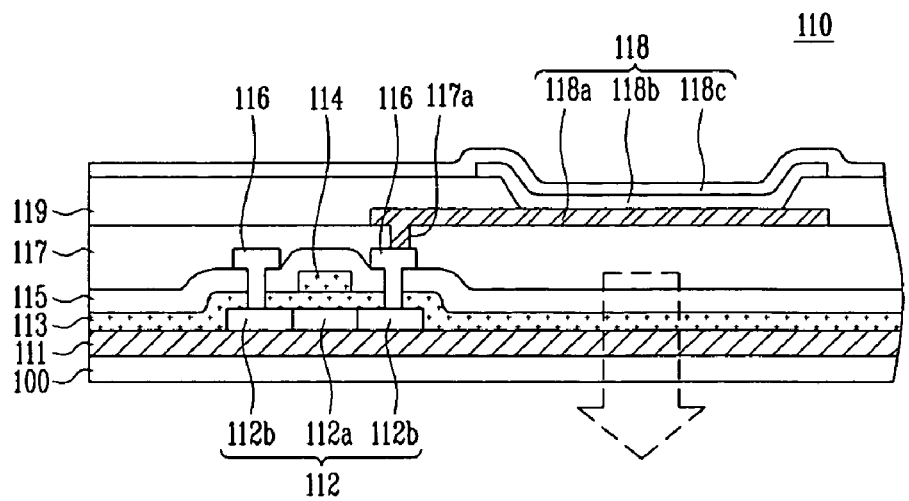
FIG. 3 is a cross-sectional view of main parts of the pixel shown in FIG. 2.

FIG. 2 is a plan view showing an organic light-emitting display device according to an embodiment. FIG. 3 is a cross-sectional view of a portion of the pixel shown in FIG. 2. FIG. 2 and FIG. 3 show a bottom emission type active matrix organic light-emitting display device wherein each pixel is provided with at least one thin film transistor and an organic light-emitting diode, however, the present invention is not limited thereto.

Referring to FIG. 2 and FIG. 3, an organic light-emitting display device according to an embodiment comprises: a first substrate 100; and a second substrate 200 disposed on the upper part of the first substrate 100 to be overlapped with at least one region of the first substrate 100. A frit 300 is applied to the interior side of the second substrate 200. A portion of the frit surrounding a pixel region 105 bonds the second substrate 200 to the first substrate 100. That is, the frit 300 is applied between the first substrate 100 and the second substrate 200, and the first and the second substrates 100 and 200 are adhered to each other by means of the frit 300 applied to surround the pixel region 105.

The first substrate 100 includes the pixel region 105, wherein a plurality of pixels 110 are formed. Scan drivers 120 and 120' and a data driver 130 for supplying a driving signal to the pixels 110 are formed on the first substrate 100. A pad region 102 is also formed on the substrate 100. The pad region 102 contains a plurality of conductive pads for supplying control signals to the scan drivers 120 and 120' and the data driver 130.

The pixel region 105 includes the region where scan lines (S1 to Sn) are arranged in rows and data lines (D1 to Dm) are arranged in columns. A plurality of pixels 110 are formed at the points where the scan lines (S1 to Sn) intersect with the data lines (D1 to Dm). The respective pixels 110 generate light having a brightness corresponding to the scan signal supplied to the scan lines (S1 to Sn) and the data signal supplied to the data lines (D1 to Dm). Thereby, forming an image on the pixel region 105. The display device shown FIGS. 2 and 3 is a bottom emission type organic light-emitting display device where light is emitted from the rear of the pixel region 105 towards the first substrate 100, and the image is displayed on the rear of the pixel region 105 as depicted by the dashed arrow in FIG. 3. For this embodiment, the first substrate 100 preferably comprises a transparent material.

The pixel 110 includes an organic light-emitting diode 118, which is a light emission element, and at least one thin film transistor connected to the organic light-emitting diode 118, as shown in FIG. 3. Thus, the pixel 110 can be part of an active organic light-emitting display device. Alternatively, the pixel may not include he thin film transistor and may then be part of a passive organic light-emitting display device.

The thin film transistor comprises a buffer layer 111 formed on the first substrate 100; a semiconductor layer 112 formed on the buffer layer 111. The semiconductor layer 112 includes a channel region 112a and source and drain regions 112b. A gate insulating film 113 is formed on the semiconductor layer 112 and a gate electrode 114 is formed on the gate insulating film 113. An interlayer insulating film 115 is formed on the gate electrode 114 and the source and drain electrodes 116 are formed on the interlayer insulating film 115 and are electrically connected to the source and drain regions 112b.

A planarization film 117 is formed over the thin film transistor. A via hole 117a exposing at least one region of the drain electrode 116 is formed in the planarization film 117. The organic light-emitting diode 118 is formed on the planarization film 117 so as to be connected to the thin film transistor through the via hole 117a. The organic light-emitting diode 118 comprises a first electrode 118a, a second electrode 118c, and an organic light-emitting layer 118b positioned therebetween. The first electrode 118a is formed on the planarization film 117 and is connected to the drain electrode of the thin film transistor through the via hole 117a. A pixel defining film 119 having an opening portion exposing at least a part of the first electrode 118a is formed over the planarization film 117 and the first electrode 118a. The organic light-emitting layer 118b is formed in the opening portion of the pixel defining film 119. The second electrode 118c is formed over the organic light-emitting layer 118b. In order to improve the efficiency of the light emitted from the rear of the pixel 110, the second electrode 118c can be configured to include a reflection layer. A passivation layer (not shown), can also be formed over the second electrode 118c. The organic light-emitting diode 118 as shown in FIG. 3 generates light having a brightness corresponding to the current supplied from the thin film transistor.

In the embodiment shown in FIG. 2, the scan drivers 120 and 120', the data driver 130, and the pad region 102 are formed in a non-pixel region of the first substrate 100 located outside of the pixel region 105. The scan drivers 120 and 120' generate a scan signal corresponding to the control signals supplied from the plurality of pads located in the pad region 102 and supplied to the scan lines (S1 to Sn). In this embodiment, two scan drivers 120 and 120' are formed on opposite sides of the pixel region 105. The scan driver 120 supplies the scan signal to the odd numbered scan lines (S1, S3, ..., Sn-1) and the scan driver 120' supplies the scan signal to the even numbered scan lines (S2, S4, ..., Sn). However, the structure of the scan drivers 120 and 120' is not limited thereto and can be modified in various ways know to those of skill in the art. The data driver 130 generates a data signal corresponding to data and control signals supplied from a plurality of pads in the pad region 102, and supplies the data signal to data lines (D1 to Dm). The pads located in the pad region 102 supply the control signals supplied from an external data source to the scan drivers 120 and 120' and the data driver 130.

The second substrate 200 is placed over the first substrate 100 such that the pixel region 105 and at least a part of the non-pixel region of the first substrate 100 are interposed between the first substrate 100 and the second substrate 200. The pixels 110 formed on the first substrate 100 include the organic light-emitting layer 118a of the organic light-emitting diode 118, etc., meaning that it can be easily deteriorated when oxygen and moisture infiltrate the region between the substrates. Therefore, in order to prevent an infiltration of oxygen and moisture into the pixel region 105, the second substrate 200 is adhered to the first substrate 100 by the frit 300 to encapsulate the pixel region 105. In the example shown in FIG. 2, the area of the second substrate encapsulated includes the scan drivers 120 and 120', however, the present invention is not limited thereto. That is, the second substrate 200 may be adhered to an area of the first substrate 100 including the pixel region 105 but excluding the scan drivers 120 and 120'. In the bottom emission type organic light-emitting display device the second substrate 200 is generally processed to be opaque or coated with a black matrix material such as a light shielding film on the exterior of the substrate 200. However, the second substrate 200 may be made of transparent material. In the example shown in FIG. 2, the frit 300 comprises a black tint and is applied to the inner side of the second substrate 200. In this way, the frit 300 can be function as an adhesive on the edges of the second substrate 200 as well as functioning as the black matrix. The frit 300 applied to the edge of the second substrate can be melted and solidified so as to bonded to the first and the second substrates 100 and 200 and adhere the first and the second substrates 100 and 200 to each other. In this way, the black matrix layer can be formed in the same step as forming the frit seal, thereby simplifying the process as well as effectively preventing the light leakage.

In the example shown, the frit 300 is applied to the entire inner side (i.e., the side to be bonded to the first substrate 100) of the second substrate 200 and the edge portion then encapsulates the pixel region 105. That is, the frit 300 is positioned at the edge of the inner side of the second substrate 200 to be bonded to the first substrate 100 and is configured to surround the pixel region 105 and the scan drivers 120 and 120' in this example. The frit 300 may comprise raw glass mixed with additives as discussed above (e.g., a powder), or the frit may also comprise glass material that has been melted and then solidified. Preferable, the frit 300, completely surrounds the pixel region 105 between the first and the second substrates 100 and 200. The edge of the frit 300 is then melted and cured, for example, with laser or infrared rays, thereby effectively blocking an infiltration of oxygen and moisture. Also, the frit 300, may comprise material such as a transition metal, causing the frit to be substantially non-transparent to visible light (e.g., have a black tint), thereby preventing light from being passed through and serving as the black matrix (BM) preventing the light leakage. Instead of serving only as an adhesive, the frit 300 in this example is used for encapsulation on the outer edge of the two substrates and is also used as the black matrix in the inner portion where the pixel region 105 is located. Thus, the second substrate 200 may be transparent. Preferably, the frit 300 is formed on the entire inner side of the second substrate 200, but only forms an adhering seal on an outer edge surrounding at least the pixel area 105. In other words, only a portion of the frit 300 surrounding the pixel region 105 is used as the frit seal adhering the first substrate 100 to the second substrate 200. The frit seal may also surround the scan drivers 120 and 120' as shown in FIG. 2. A detailed explanation of the encapsulating method using the frit 300 will now be discussed.

Figure 4:
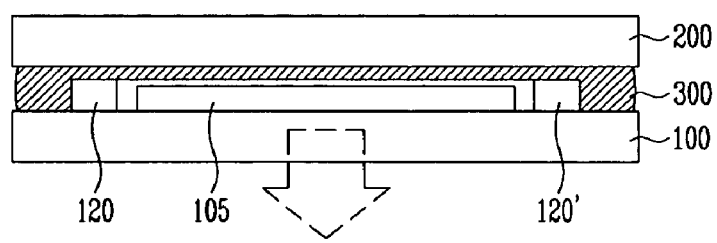
FIG. 4 and FIG. 5 are cross-sectional views of an organic light-emitting display device taken along the line marked A-A' in FIG. 2.

FIG. 4 is a cross-sectional view of an organic light-emitting display device taken along A-A' line in FIG. 2. The pixel region 105 formed on the first substrate 100 is completely surrounded by the first substrate 100, the second substrate 200 and the frit 300. The frit 300 material may be substantially non-transparent to visible light (e.g., tinted black) and be formed over the entire inner side of the second substrate 200 including the edges where the first and the second substrates 100 and 200 are bonded as well as the region between the first and the second substrates 100 and 200 including the pixel region 105, thereby effectively blocking the light leakage. Preferably, the frit 300 is used in a bottom emission type of organic light-emitting display device as shown. The peripheral frit on the edges of the substrate is preferably formed to be thicker than the frit layer in the interior. In this way, the frit 300 comprises a peripheral frit seal surrounding at least the pixel region 105 and bonding the first and second substrates 100 and 200, and a thinner interior frit layer located proximal to the pixel region 105 and not contacting the array of pixels in the pixel region 105.

As discussed above, the frit 300 may comprise a glass material, a filler material to adjust absorption characteristics, and a filler material for adjusting thermal expansion characteristics. The frit 300 can be applied to the second substrate 200 in the form of a frit paste and cured to form a frit seal. The frit seal can then be melted, e.g., by irradiation with laser or infrared rays and cured again between the first and the second substrates 100 and 200, thereby adhering the first substrate 100 to the second substrate 200. Preferably, the laser or infrared rays are irradiated only to the peripheral frit 300 positioned outside of the pixel region 105 and the scan drivers 120 and 120'. In this way, the internal circuits of the pixel region 105 and the scan drivers 120 and 120' can be undamaged. Therefore, laser or infrared rays should be irradiated to only the peripheral frit 300 applied to the areas where elements susceptible to damage are not formed. By irradiating laser or infrared rays along the edge of the frit 300 wherein elements susceptible to damage are not formed, the frit 300 encapsulates the first and the second substrates 100 and 200 by adhering thereto. The portion of the frit at the edge part can absorb laser or infrared rays to be melted and cured. However, the thinner frit layer applied to the region in which the susceptible elements are formed, such as the pixel region 105 and scan drivers 120 and 120', is not adhered to the pixel region 105 and scan drivers 120 and 120' formed on the first substrate 100 and functions only as the black matrix preventing the light leakage.

Figure 5:
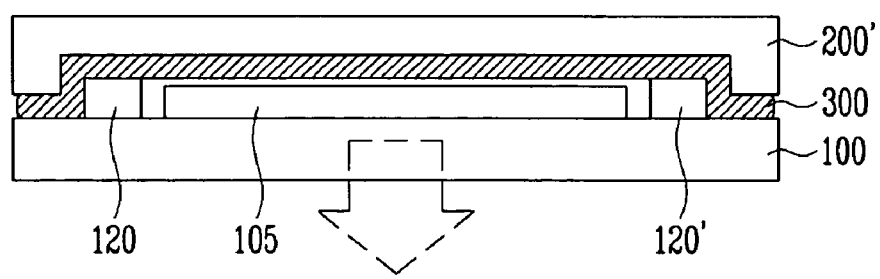

The example shown in FIG. 4 shows the second substrate 200 a flat panel of glass. However, in another embodiment, the second substrate 200 can be configured to be an etched panel wherein the thickness of a center part portion is thinner than that of a peripheral edge portion. In this embodiment, the frit 300 can be formed of the same thickness over the entire second substrate 200. FIG. 5 shows a cross sectional view of an organic light-emitting display device including an etched second substrate 200'. Since the etched second substrate 200' has a thinner inner portion in the region proximal to the pixel region 105 and the scan drivers 120 and 120', the frit 300 can be applied in the same thickness across the second substrate 200'. The peripheral edge of the frit 300 will then be the only portion bonding the first substrate 100 and the second substrate 200'.

FIG. 6a to FIG. 6d are cross-sectional views showing various stages in a process of fabricating the organic light-emitting display device shown in FIG. 4. Referring to FIG. 6a to FIG. 6d, the method for fabricating the organic light-emitting display device shown in FIG. 4 will be described in detail. For convenience, although FIG. 6a to FIG. 6d show the method for fabricating an individual organic light-emitting display device, in fact, a plurality of display device cells can be fabricated in a sheet unit and then individual display devices can be separated from the sheet unit (e.g., by cutting).

Figure 6A:
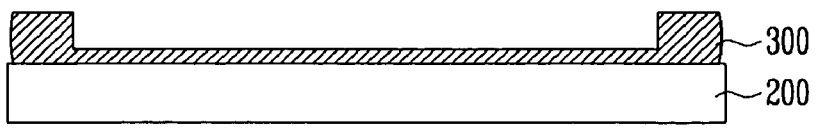
FIG. 6A to FIG. 6D are cross-sectional views showing various states in a process of fabricating the organic light-emitting display device shown in FIG. 4.

Referring to FIG. 6a, the frit 300 is applied to one side of the second substrate 200 to be bonded to the first substrate 100. That is, the frit 300 is applied to the second substrate 200 to be overlapped with the entire encapsulating region surrounding at least the pixel region 105 of the first substrate 100, which will be encapsulated with the second substrate 200 and the frit 300. Initially, the frit 300 follows the flat shape of the second substrate 200 however, the frit 300 in a peripheral region surrounding the pixel region 105 is formed to be thicker than the frit 300 facing the pixel region 105. After the frit 300 is applied to the second substrate 200 in a frit paste state, it is then burned or melted such that moisture or organic binder included in the paste is removed and then cured. The frit paste can be transformed to a gel state by adding oxide power and organic substance to the glass powder and increasing the temperature of the frit paste 300 preferably to a range from about 300° C. to about 500° C. It is preferable that the thickness of the frit 300 be from about 10 µm to about 20 µm. If the frit seal is about 20 µm or more, a large amount of energy may be required at the time of sealing with laser so that the power of the laser needed to melt the frit may be excessively high, or the scan speed of the laser may be excessively slow, resulting in possible heat damage to the frit, the substrates and/or the display elements. If the frit seal is about 10 µm or less, defects due to unequal deposition of the frit material may occur at an unacceptable rate.

Figure 6B:
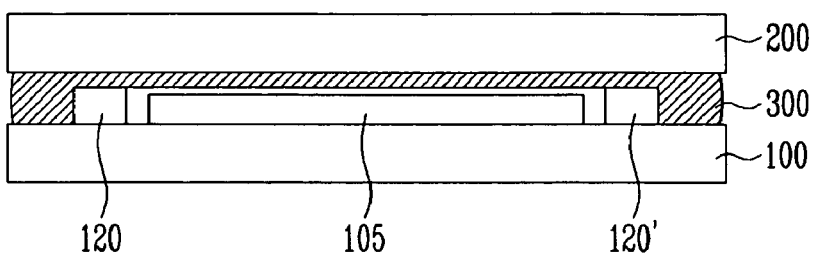

In one embodiment, the first substrate 100 on which an array of organic light emitting pixels is formed in the pixel region 105 and the scan drivers 120 and 120' are formed is prepared in a previous process and provided as an unfinished device. The unfinished device formed on he first substrate 100 is placed over the second substrate 200 so that the pixel region 105 is encapsulated in a space defined by the first and second substrates 100 and 200, the peripheral frit seal and the inner frit layer as shown in FIG. 6b. In this example, the frit 300 is positioned so that it is overlapped with the entire inner side of the second substrate 200 with the array interposed between the first and second substrates 100 and 200.

Figure 6C:
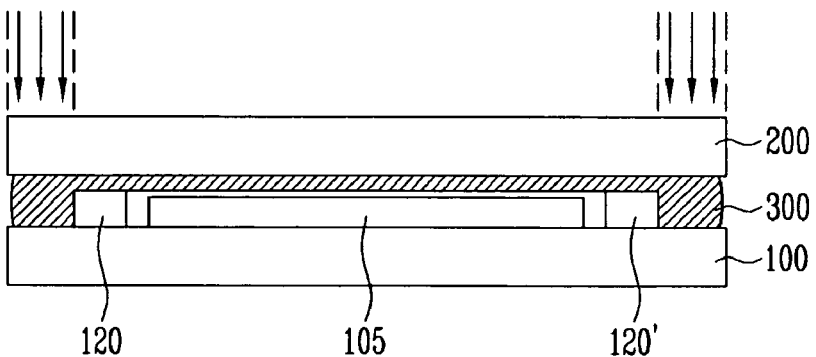
Figure 6D:
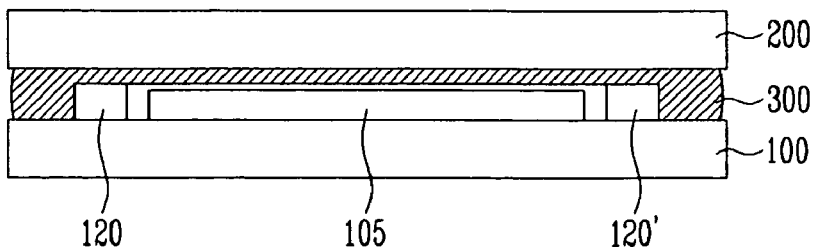

After positioning the first and second substrates as shown in FIG. 6b, laser or infrared rays are irradiated to the frit seal positioned in the outer region of the substrates in which no elements susceptible to damage by irradiation are formed, as shown in FIG. 6c. The frit seal portion of frit 300, to which laser or infrared rays are irradiated, is melted by absorption of the energy in the laser or infrared rays. Preferably the wavelength of laser or infrared rays is in a range from about 800 nm to about 1200 nm (more preferably, about 810 nm). Preferably, the beam size is configured to be from about 1.0 nm to about 3.0 nm in diameter, and the output electric power is configured to be from about 25 watt to about 45 watt. The portions of the substrates to which laser or infrared rays are not to be irradiated can be masked. That is, the scan drivers 120 and 120', the pixel region 105 and the wirings (not shown) positioned between the scan drivers 120 and 120' and the pixel region 105 can be masked so as not to be irradiated with laser or infrared rays. In this way, the wirings and the elements that are susceptible to damage by the irradiation may be prevented from being adversely affected by the laser or infrared rays. In one embodiment, a mask comprising a double film of copper and aluminum can be used as the mask.

The irradiation of the frit 300 melts the outer frit seal portion surrounding the pixel region 105 containing the array of organic light-emitting pixels. The frit seal is then allowed to resolidify thereby adhering the first substrate 100 to the second substrate 200 with the outer frit seal portion only. The inner frit layer serving as the non-transparent black mask is substantially unaffected by the irradiation process since it was masked from the irradiation beam.

Although the example process discussed in reference to FIGS. 6a to 6d comprises forming the frit 300 on the second substrate 200, the process is not limited thereto. For example, the frit 300 can first be applied to the first substrate 100 on which the pixel region 105 is formed, or can be applied to both the first and the second substrates 100 and 200, adhering the first and the second substrates 100 and 200. Also, when the second substrate 200 is configured to be an etched glass as shown in FIG. 5, the frit 300 can be applied to the entire sides of the second substrate 200 in the same thickness. This may further simplify the step of forming the frit 300 including the inner portion serving as the black matrix and the outer portion serving as the frit seal. In the organic light-emitting display device and the method for fabricating the same as described above, the first and the second substrates 100 and 200 are adhered by means of the frit 300, resulting in that the infiltration of oxygen and moisture, etc. into the internal space including the pixel region 105 can be effectively blocked. Also, in the bottom emission type organic light-emitting display device, the frit 300 can be non-transparent (e.g., tinted black) and be formed on the entire inner side of the second substrate 200 and serve to function as the black matrix, thereby improving image quality by effectively preventing light leakage. In this case, since the black matrix can be formed in the same step that the frit seal for encapsulating the first and the second substrates 100 and 200 is formed, there is no need to make the second substrate 200 opaque or to form the light shielding film thereon in a second step. Thus, simplifying the fabrication process and reducing the processing time. The frit 300 can be configured to include a frit seal surrounding the pixel region 105 and the scan drivers 120 and 120'. Since the inner portion of the frit layer is not irradiated with laser or infrared rays, but only the outer edge portion of the frit 300, the pixel elements and the scan drivers 120 and 120' can be protected from damage by irradiation.

As described above, according to the organic light-emitting display device and the method for fabricating the same, the first and the second substrates are adhered by means of the frit, resulting in that the infiltration of oxygen and moisture, etc. into the internal space including the pixel region can be effectively blocked. Also, in the bottom emission type organic light-emitting display device the frit tinged with black is formed in the entire sides of the inner side of the second substrate and is functioned as the black matrix, improving image quality by effectively preventing the light leakage. In this case, since the black matrix can simultaneously be formed in the step for encapsulating the first and the second substrates, there is no need to make the second substrate opaque or to form the light shielding film thereof, simplifying the process thereof and reducing the process time thereof.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light-emitting device comprising:
   a first substrate;
   a second substrate;
   an array of light-emitting pixels interposed between the first and the second substrate;
   a frit layer formed between the second substrate and the array, wherein the frit layer is substantially non-transparent to visible light; and
   a frit seal interconnecting the first substrate and the frit layer while surrounding the array on every side of the array such that the frit layer, the frit seal and the first substrate form an enclosed space where the array is located, wherein the frit seal is integral with and comprises the same composition as the frit layer and provides an exterior surface of the device.

2. The device of claim 1, wherein the frit layer is formed on the second substrate, and wherein the second substrate comprises a single layer or multiple layers.

3. The device of claim 1, wherein the frit layer is not adhered to the array of light emitting pixels.

4. The device of claim 1, wherein the first substrate and the second substrate are transparent.

5. A method of making the organic light-emitting device of claim 1, the method comprising:
   providing an unfinished device comprising the first substrate and the array of organic light emitting pixels;
   providing the second substrate, the frit layer and a peripheral frit, wherein the frit layer is formed over a surface of the second substrate, wherein the peripheral frit surrounds the frit layer and is connected to the frit layer;
   placing the second substrate over the unfinished device such that the array is interposed between the first substrate and the frit layer, and the peripheral frit surrounds the array; and
   melting and resolidifying at least part of the peripheral frit to form the frit seal so as to interconnect the unfinished device and the second substrate via the frit seal.

6. The method of claim 5, wherein the frit layer is substantially non-transparent to visible light.

7. The method of claim 6, wherein melting the peripheral frit comprises irradiating the peripheral frit with laser or infrared rays.

8. The method of claim 7, wherein a wavelength of the laser or infrared rays are set to be from about 800 nm to about 1200 nm.

9. The method of claim 7, further comprising masking at least a portion of the frit layer while irradiating the peripheral frit.

10. The method of claim 5, wherein the peripheral frit is thicker than the frit layer, wherein the thickness is measured perpendicular to the surface of the second substrate.

11. The method of claim 5, wherein the peripheral frit is applied to at least one of the first substrate and the second substrate in a form of a paste comprising a glass material and a filler material to adjust absorption characteristics, the method further comprising heating the peripheral frit to a temperature sufficient to cure the frit paste.

12. The method of claim 11, wherein heating the frit paste comprises irradiating the frit paste with laser or infrared rays.

13. The method of claim 11, wherein the frit paste is heated to a temperature in a range from about 300° C. to about 500° C.

14. An organic light-emitting device comprising:
   a first substrate;
   a second substrate;
   an array of light-emitting pixels interposed between the first and the second substrate;
   a frit layer formed between the second substrate and the array; and
   a frit seal interconnecting the first substrate and the frit layer while surrounding the array such that the frit layer, the frit seal and the first substrate form an enclosed space where the array is located, wherein the frit seal is integral with and comprises the same composition as the frit layer and provides an exterior surface of the device;
   wherein the frit layer and the frit seal comprises a glass material, at least one of a filler material to adjust absorption characteristics, and a different filler material to adjust thermal expansion characteristics.

15. An organic light-emitting device comprising:
   a first substrate;
   a second substrate;
   an array of light-emitting pixels interposed between the first and the second substrates, wherein the second substrate is thinner in an inner portion opposite the array than in an outer portion surrounding the inner portion; and
   a frit layer formed over the inner and the outer portions of the second substrate facing the first substrate such that the frit layer over the inner and outer portions in combination with the first substrate form an enclosed space where the array is located, wherein the first substrate and the second substrate are adhered to each other by the frit layer only in the outer portion, wherein the frit layer is substantially non-transparent to visible light, and wherein the frit layer provides an exterior surface of the device.

16. An organic light-emitting device comprising:
   a first substrate;
   a second substrate;
   an array of light-emitting pixels interposed between the first and the second substrates, wherein the second substrate is thinner in an inner portion opposite the array than in an outer portion surrounding the inner portion; and a frit layer formed over the inner and the outer portions of the second substrate facing the first substrate such that the frit layer over the inner and outer portions in combination with the first substrate form an enclosed space where the array is located, wherein the first substrate and the second substrate are adhered to each other by the frit layer in the outer portion, and the frit layer provides an exterior surface of the device;

wherein the frit layer is formed over the inner and outer portions of the second substrate in substantially the same thickness.

* * * * *

UNITED STATES PATENT AND TRADEMARK OFFICE
CERTIFICATE OF CORRECTION

| | |
|---|---|
| PATENT NO. | : 7,893,613 B2 |
| APPLICATION NO. | : 11/641359 |
| DATED | : February 22, 2011 |
| INVENTOR(S) | : Won Kyu Kwak |

Page 1 of 1

It is certified that error appears in the above-identified patent and that said Letters Patent is hereby corrected as shown below:

In Column 7, Line 16, after "thereof" insert --.--.

In Column 8, Line 30, change "cellusolve" to --cellosolve--.

In Column 10, Line 44, change "he" to --the--.

In Column 13, Line 46, change "200 however," to --200. However,--.

In Column 14, Line 2, change "he" to --the--.

Signed and Sealed this
Fourth Day of October, 2011

David J. Kappos
*Director of the United States Patent and Trademark Office*